(12) United States Patent
Matsumoto et al.

(10) Patent No.: US 8,400,853 B2
(45) Date of Patent: Mar. 19, 2013

(54) SEMICONDUCTOR CHIP AND METHOD OF REPAIR DESIGN OF THE SAME

(75) Inventors: Chizu Matsumoto, Fujisawa (JP); Kaname Yamasaki, Higashiyamato (JP); Michinobu Nakao, Hachioji (JP); Yoshikazu Saitou, Hamura (JP)

(73) Assignee: Renesas Electronics Corporation, Kawsaki-shi (JP)

( * ) Notice: Subject to any disclaimer, the term of this patent is extended or adjusted under 35 U.S.C. 154(b) by 364 days.

(21) Appl. No.: 12/778,120

(22) Filed: May 12, 2010

(65) Prior Publication Data

US 2010/0290299 A1    Nov. 18, 2010

(30) Foreign Application Priority Data

May 13, 2009  (JP) ................ 2009-116355

(51) Int. Cl.
*G11C 7/00* (2006.01)
(52) U.S. Cl. ............ 365/200; 365/201; 365/230.03
(58) Field of Classification Search ................ 365/200, 365/201, 230.03
See application file for complete search history.

(56) References Cited

U.S. PATENT DOCUMENTS

| | | | |
|---|---|---|---|
| 6,246,618 B1 | 6/2001 | Yamamoto et al. | |
| 6,950,351 B2 | 9/2005 | Lim | |
| 2003/0005353 A1* | 1/2003 | Mullins et al. | 714/5 |
| 2004/0225939 A1* | 11/2004 | Adams et al. | 714/733 |
| 2006/0184848 A1* | 8/2006 | Serizawa et al. | 714/727 |
| 2009/0158087 A1* | 6/2009 | Maeno et al. | 714/6 |
| 2009/0217102 A1* | 8/2009 | Co | 714/42 |

FOREIGN PATENT DOCUMENTS

| | | |
|---|---|---|
| CN | 1332459 A | 1/2002 |
| JP | 08-262116 A | 10/1996 |
| JP | 2006-236551 A | 9/2006 |
| JP | 2007-305670 A | 11/2007 |

OTHER PUBLICATIONS

Schuster, "Multiple Word/Bit Line Redundancy for Semiconductor Memories", IEEE Journal of Solid-State Circuits, vol. SC-13, No. 5, Oct. 1978, pp. 698-703.
Hamamura et al., "Repair Yield Simulation with Iterative Critical Area Analysis for Different Types of Failure", IEEE International Symposium on Defect and Tolerance in VLSI System, pp. 305-313, 2002.
Office Action issued Nov. 30, 2011, in Chinese Patent Application No. 201010176664.5.

* cited by examiner

*Primary Examiner* — Hoai V Ho
(74) *Attorney, Agent, or Firm* — Miles and Stockbridge P.C.

(57) ABSTRACT

A repair circuit achieving "group repair of mixed multiple repair methods" and a repair design method for making a product margin suitable are provided. In a chip mounting multiple RAMs, a repair circuit and a repair design method in consideration of a trade-off of chip yield and area increase along with mounting a repair circuit are provided. A repair circuit achieving "group repair of mixed multiple repair methods" which can select existence of a repair circuit, and one or more repair methods from I/O, column, and row repairs on the RAMS in the chip, respectively, when a repair circuit is mounted. The repair circuit performs repair per RAM group by sorting the RAMs mounting a repair circuit into a plurality of RAM groups. Also, a repair method which makes a number of acquired good chips in a wafer and an estimation method of the RAM grouping method are provided.

3 Claims, 16 Drawing Sheets

FIG. 8

| Name of Signal | Description of Signal |
|---|---|
| ad[9:0] | Memory Address |
| rb_ad[9:0] | Memory Address Generated By MBIST |
| adff[9:0] | Boundary Latch For Memory Address, also Fail Address Register |
| rai[5:0] | Repair Address |
| rei | Repair Availability Signal    rei=0 : Available / rei=1 : Unavailable |
| failp | Fail Signal (Real-Time Comparison Result) |
| fail | Fail Signal (failp l failff) |
| failff | Fail Signal (FF Output with fail Input) |
| dif_ad | Address Comparison Signal |
| dif_adff | Address Comparison Signal (FF Output with dif_ad Input) |
| multifail | Multiple Row/Col fail Signal<br>Single Row/Col fail<br>Multiple Row/Col fail |

FIG. 13

| Combination | I/O Repair [Gr. No.] | Row Repair [Gr. No.] | Col Repair [Gr. No.] |
|---|---|---|---|
| I | 0 | 3 | 0 |
| II | 0 | 2 | 1 |
| III | 1 | 2 | 0 |
| ⋮ | ⋮ | ⋮ | ⋮ |

FIG. 14

| RAM | No Repair | I/O Repair | Row Repair | Col Repair |
|---|---|---|---|---|
| A | 0.00063 | 0.00048 | 0.00051 | 0.00050 |
| B | 0.00021 | 0.00031 | 0.00030 | 0.00030 |
| C | 0.00055 | 0.00041 | 0.00040 | 0.00049 |
| ⋮ | ⋮ | ⋮ | ⋮ | ⋮ |

SEMICONDUCTOR CHIP AND METHOD OF REPAIR DESIGN OF THE SAME

CROSS-REFERENCE TO RELATED APPLICATION

The present application claims priority from Japanese Patent Application No. 2009-116355 filed on May 13, 2009, the content of which is hereby incorporated by reference into this application.

TECHNICAL FIELD OF THE INVENTION

The present invention relates to a technique effectively applied to a thin-film device represented by LSI etc., which is a semiconductor chip (semiconductor integrated circuit) embedding a plurality of RAMs (random access memories) and logic circuits, wherein a test circuit of the RAM and a test circuit of the logic circuit are mounted, and also relates to a technique of determining a repair method of the RAM. The present invention is a technique effectively applied to a logic LSI such as a system LSI (large-scale integrated circuit) embedding, for example, RAMs and CPUs (central processing units).

BACKGROUND OF THE INVENTION

In resent years, along with achieving higher functionality in a logic LSI mounting RAMs and/or CPUs, called system LSI, the number of types and the scale of the RAMs mounted in a chip have been increased. In a RAM unit, wirings and transistors are particularly densely provided on a chip, and they are prone to cause a failure. Thus, yield is generally improved by mounting a spare circuit that is replaceable when a failure occurs, that is, a repair circuit.

Repair circuit design of the system LSI has a problem of increasing test time along with an increase in mounting scale and a problem of increasing the number of external input/output pins for tester connections along with an increase in the number of mounted RAMs, and thus a repair design for reducing the problems has been desired. Therefore, conventionally, BIST (built-in self test) which determines good/bad of the RAM unit by using a circuit mounted inside the chip (Japanese Patent Application Laid-Open Publication No. H08-262116 (Patent Document 1)), and moreover, BISR (built-in self repair) which also determines repair automatically in addition have been developed.

Further, as to a system LSI mounting over hundred kinds of various RAMs in a chip, there are some design methods in consideration of a trade-off of an increase in chip area due to mounting a repair circuit and a yield improvement. Examples are: an I/O group repair method performing I/O repairs per RAM group, wherein the I/O repairs, which have been performed per RAM, are put together into some RAM groups (Japanese Patent Application Laid-Open Publication No. 2006-236551 (Patent Document 2)); and a method of calculating yield for making the number of groups suitable (Japanese Patent Application Laid-Open Publication No. 2007-305670 (Patent Document 3)).

SUMMARY OF THE INVENTION

Generally known RAM repair methods are: I/O repair performing replacement to a repair circuit in a unit of I/O including failure portions; Col repair (column repair) performing replacement in a unit of column (column direction; hereinafter, denoted by "Col"); and Row repair performing replacement in a unit of row (hereinafter, denoted by Row). To determine the most suitable one among these repair methods, it is required to consider the number of I/Os of subject RAMs, a shape of a memory cell array of each I/O, and a scale of the RAM.

For example, when a RAM has a memory cell array of each I/O being vertically long, a possibility of repair is higher when repair circuits are mounted in a vertical direction, and thus the Col repair performing repair in the vertical direction is effective. Meanwhile, when the scale of the RAM is small or a failure density is small, a possibility of occurrence of failure is low in the RAM, and thus the Row repair is advantageous because its area increase of a repair circuit is small even when the possibility of succeeding repair is low. Further, when the scale of a RAM is small and the number of I/Os is large, since the I/O repair has a smaller area increase of a repair circuit than the Col repair, the I/O repair can be the most suitable repair method.

Therefore, to make the chip repair efficiency suitable in a system LSI mounting various RAMs, it is desired to make RAMs having different repair methods such as I/O repair, Col repair, and Row repair mountable in the same chip, and to perform repairs by putting the RAMS mounting the same repair method together into some groups (herein, the method is denoted by "group repair of mixed multiple repair methods").

Meanwhile, the conventional techniques of Patent Documents 2 and 3 are limited to the I/O group repair, and there has not been an invention of a repair circuit for performing group repairs of a plurality of methods in one chip. Further, in the group repair of mixed multiple repair methods, to maximize product margin by improving repair efficiency with making the repair design suitable, which RAMs are put together into the same group is required to be determined after existence of a mounted repair circuit is determined per RAM, and further, which repair method is allocated to which RAM is determined. Meanwhile, there has been no report of a specific repair method for achieving these goals.

Accordingly, the present invention has been made in view of the above problems, and a first preferred aim of the present invention is to provide a repair circuit achieving the "group repair of mixed multiple repair methods." In addition, a second preferred aim is to provide a repair method for making the product margin suitable.

The above and other preferred aims and novel characteristics of the present invention will be apparent from the descriptions in the present specification and the accompanying drawings.

The typical ones of the inventions disclosed in the present application will be briefly described as follows.

That is, a summary of the typical ones of the inventions is that, in a semiconductor chip mounting a plurality of RAMs, can be a plurality of (multiple) repair methods can be set to each of the RAMs, and each of the RAMs includes a repair circuit selecting and setting a repair method from the plurality of repair methods per RAM so that an area for good chip is minimum.

More specifically, a RAM hard macro generation method which can select which one to mount or not to from the I/O repair, Row repair, and Col repair to RAMs having any combinations of RAM types, sizes, etc. According to this method, RAMs having different repair methods can be mounted in the same chip. Note that the present method has been already established regarding the I/O method, and thus the method can be achieved also by extending the same to the Row repair and Col repair.

Next, to test and repair in accordance with a specification of each of the RAMs mounted in the same chip as described above, an automatic design method in which a built-in self test (BIST) circuit, a built-in self repair (BISR) circuit, and a fuse are inserted is used. According to the method, even when RAMs having different repair methods are mounted in the same chip, test and repair are available. Note that, the present method has been already established regarding the I/O repair method, and thus the method can be achieved also by extending the same to the Row repair and Col repair.

Note that, since an overhead of the GIST circuit and BISR circuit leads to an increase in chip area, a circuit configuration which makes the overhead minimum per repair method is provided. Note that, the I/O repair method has been already established as described in Patent Document 2.

Further, the present invention provides a repair design method and a system of the same for the group repair of mixed multiple repair methods in consideration of a trade-off of a chip yield improvement and an area increase due to mounting a repair circuit.

The effects obtained by typical aspects of the present invention will be briefly described below.

(1) Existence of mounted repair circuits can be selected in accordance with a number of I/Os of a RAM, a shape of a memory cell array of each I/O, and a scale; and a repair circuit method per RAM can be selected with respect to repaired RAMs. Thus, a repair efficiency can be improved as compared with the conventional I/O group repair, thereby contributing to an improvement in product margin.

(2) By using a boundary latch, special hardware for acquiring repair information is not necessary, and thus a chip area can be reduced.

(3) In a conventional repair analysis method, (ATE: automatic test equipment), fail addresses are accumulated during a test, and a repair analysis such as repairability determination, repair code generation, etc. is carried out after the test ends. Meanwhile, in the present method, since repair information can be acquired from fail addresses, a special sequence is not necessary, and thus test time can be shortened more than the conventional method, thereby reducing a test cost.

(4) Since the Col repair and Row repair take shorter repair test time including repair analysis than the I/O repair does, an increase in test time due to mixed mount of a plurality of repair methods can be suppressed.

(5) Since the most suitable candidate and a repair design method of the same can be selected from a plurality of mounted candidate RAMs satisfying required functions, the present invention contributes to an improvement in product margin.

BRIEF DESCRIPTIONS OF THE DRAWINGS

FIG. 8 is a diagram illustrating descriptions of signals illustrated in FIG. 7 according to the embodiment of the present invention;

FIG. 13 is a diagram illustrating combination extraction examples of repaired RAM group candidates according to the embodiment of the present invention;

FIG. 14 is a diagram illustrating a list of required areas for good RAM according to the embodiment of the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<Summary of the Embodiments>

[Concept of Group Repair of Mixed Multiple Repair Methods]

Figure 1:
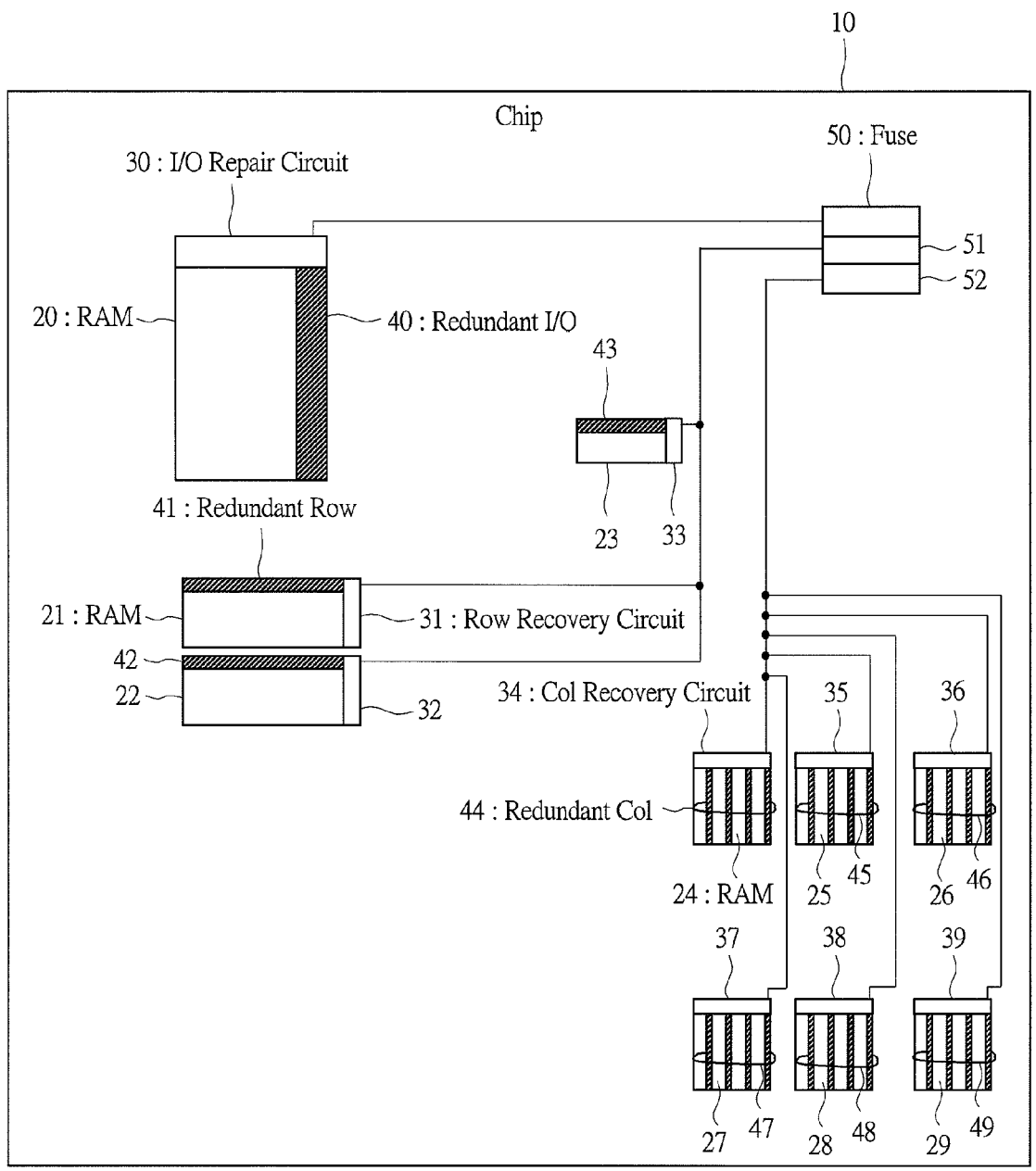
FIG. 1 is a diagram illustrating a concept of a group repair of mixed multiple repair methods in a semiconductor chip according to an embodiment of the present invention.

FIG. 1 is a diagram illustrating a concept of a group repair of mixed multiple repair methods in a semiconductor chip according to an embodiment of the present invention.

In FIG. 1, a RAM 20 mounting an I/O repair circuit 30 and a redundant I/O 40; a RAM 21 mounting a Row repair circuit 31 and a redundant Row 41; a RAM 22 mounting a Row repair circuit 32 and a redundant Row 42; a RAM 23 mounting a Row repair circuit 33 and a redundant Row 43; a RAM 24 mounting a Col repair circuit 34 and a redundant Col 44; a RAM 25 mounting a Col repair circuit 35 and a redundant Col 45; a RAM 26 mounting a Col repair circuit 36 and a redundant Col 46; a RAM 27 mounting a Col repair circuit 37 and a redundant Col 47; a RAM 28 mounting a Col repair circuit 38 and a redundant Col 48; and a RAM 29 mounting a Col repair circuit 39 and a redundant Col 49 are mounted inside one chip 10.

When an I/O repair is mounted, a redundant I/O is, as illustrated by the redundant I/O 40, arranged in a Col direction in a unit of RAM. On the other hand, when a Col repair is mounted, a redundant Col is, as illustrated by the redundant Cols 44 to 49, arranged in the Col direction in a unit of I/O. Also, when a Row repair is mounted, a redundant Row is, as illustrated by the redundant Rows 41 to 43, arranged in the Row direction in a unit of RAM.

In FIG. 1, the RAM 20 is connected with a fuse 50, the RAM 21, RAM 22 and RAM 23 are grouped and then connected with a fuse 51, and the RAM 24, RAM 25, RAM 26, RAM 27, RAM 28 and RAM 29 are grouped and then connected with the fuse 52, wherein repair is performed in a unit of fuse. These fuses 50 to 52 are examples of non-volatile memories.

Here, when repair circuits of respective RAM groups are connected in serial, a register for parallel-serial conversion upon fuse output is required to be provided. Also, a register may be provided when the connection is in parallel to achieve power reduction etc. This register is an example of a volatile memory.

Note that, in the following, descriptions of the I/O repair method will be omitted as it has been already established as described in Patent Document 2.

[Row Repair Method]

Figure 2:
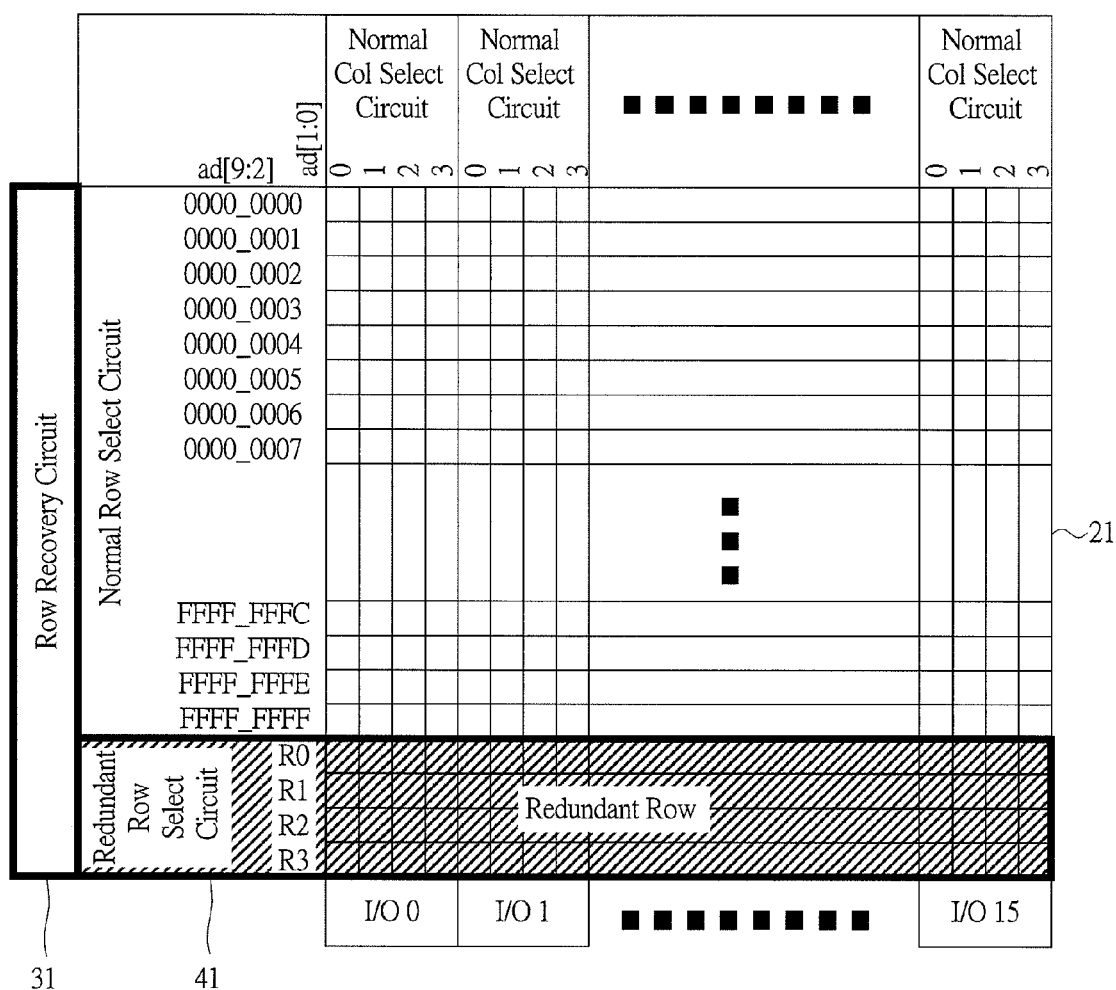
FIG. 2 is a diagram illustrating an example of a RAM including a repair circuit of a Row repair method according to the embodiment of the present invention.

FIG. 2 is a diagram illustrating an example of a RAM including a repair circuit of a Row repair method. While a part of the RAM of Row repair method including one set of redundant rows (the RAM 21 mounting the Row repair circuit 31 and the redundant Row 41 illustrated in FIG. 1) is illustrated in FIG. 2, the other parts (the RAM 22 mounting the Row repair circuit 32 and the redundant Row 42, and the RAM 23 mounting the Row repair circuit 33 and the redundant Row 43) are configured in the same manner.

As one example, a number of normal words is 1024 words=256 Rows×4 Cols, a number of normal I/O is 16 bits, and a repair unit is 4 Rows. The reference numeral 21 denotes a RAM configured by a normal Row select circuit, normal Col select circuits, and a normal memory cell array for 256 Rows×4 Cols. The reference numeral 31 denotes a Row repair circuit and the reference numeral 41 denotes a redundant Row. The redundant Row 41 is configured by a redundant Row select circuit and a redundant memory cell array for 4 Cols. When an address signal is given as ad [9:0], a Row address is ad [9:2], and a Col address is ad[1:0], and ad[9:4] of 6 bits remained when low-order 2 bits are subtracted from 8 bits of the Row address ad[9:2] is a repair address.

[Col Repair Method]

Figure 3:
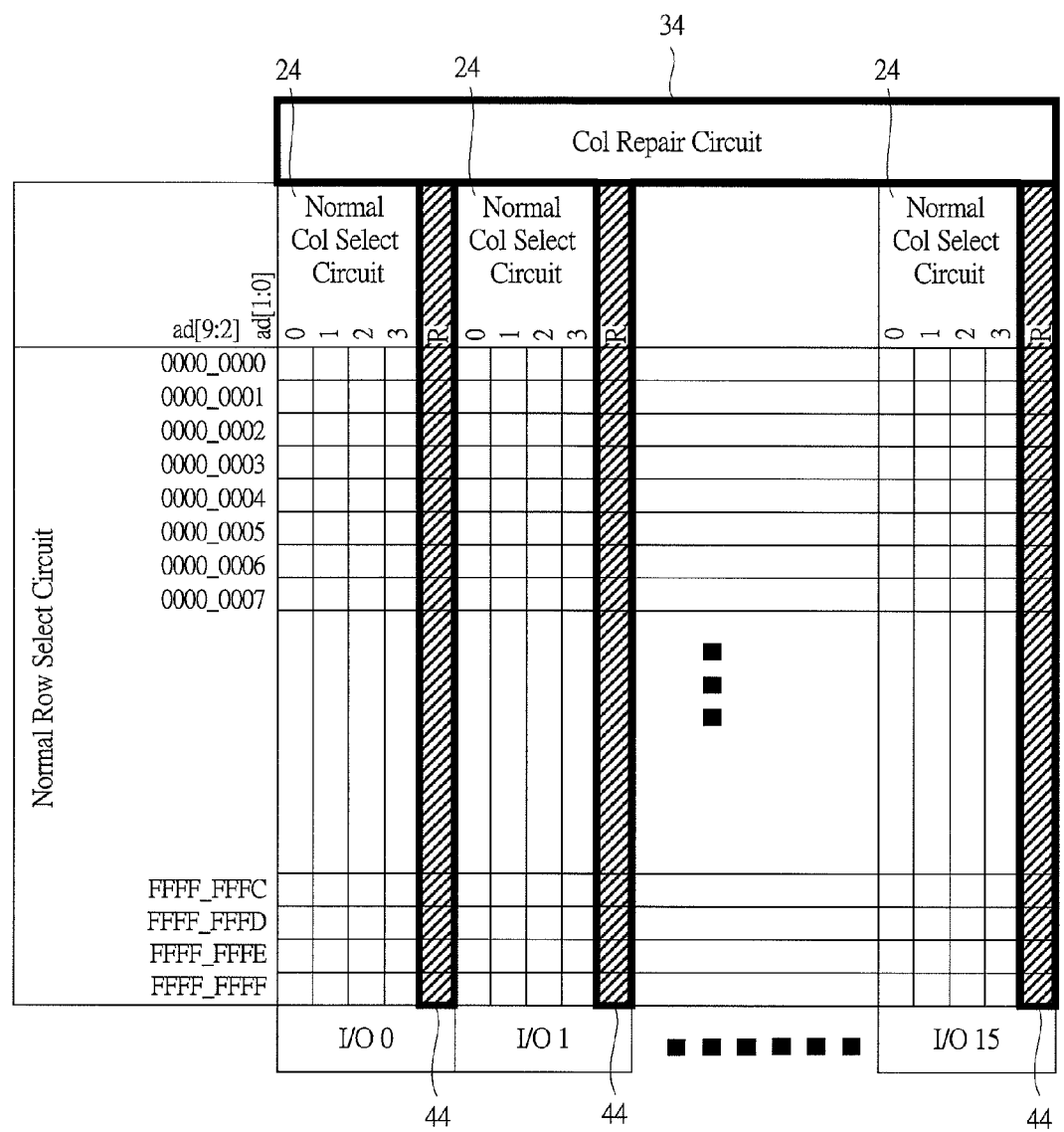
FIG. 3 is a diagram illustrating an example of a RAM including a repair circuit of a Col repair method according to the embodiment of the present invention.

FIG. 3 is a diagram illustrating an example of a RAM including a repair circuit of Col repair method. In FIG. 3, while a part of the RAM of Col repair method including redundant Cols, wherein one set of redundant Cols are provided to every I/O (the RAM 24 mounting the Col repair circuit 34 and the redundant Col 44), is illustrated, the other parts (the RAM 25 mounting a Col repair circuit 34 and a redundant Col 45, the RAM 26 mounting the Col repair circuit 36 and the redundant Col 46, the RAM 27 mounting the Col repair circuit 37 and the redundant Col 47, the RAM 28 mounting the Col repair circuit 38 and the redundant Col 48, and the RAM 29 mounting the Col repair circuit 39 and the redundant Col 49) are configured in the same manner.

As one example, a number of normal words and a number of I/Os, and address configurations of Row and Col are the same as those of FIG. 2. A repair unit is 1 Col. The reference numeral 24 denotes a RAM configured by normal Col select circuits, a normal Row select circuit, and a normal memory cell array for 4 Cols per I/O. The reference numeral 34 denotes a Col repair circuit, and the reference numeral 44 denotes a redundant Col. The redundant Col 44 is provided per I/O, and configured by a redundant Col select circuit and a redundant memory cell array for 1 Col. When a Col address is given as ad[1:0], 2 bits of the same is a repair address as it is.

[BIST Circuit and BISR Circuit]

Figure 4:
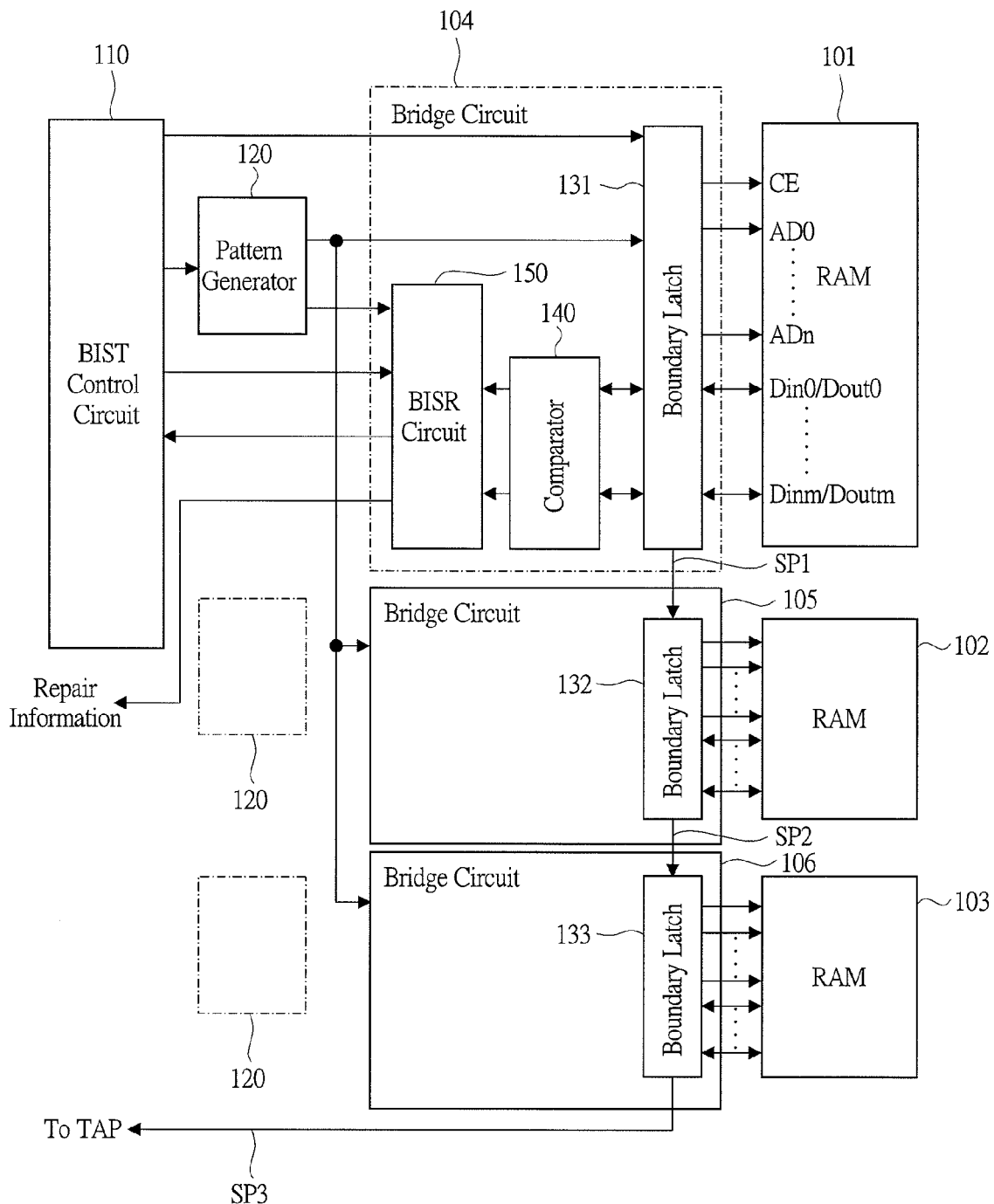
FIG. 4 is a diagram illustrating an outline of a BIST circuit and a BISR circuit according to the embodiment of the present invention.

FIG. 4 is a diagram illustrating an outline of a BIST circuit and a BISR circuit.

As illustrated in FIG. 4, bridge circuits 104 to 106 performing test and repair analysis on the RAMs 101 to 103, respectively, are provided. Address and write data necessary for the test and expectation value data are generated by a pattern generator 120. A BIST control circuit 110 initializes the pattern generator 120 and the bridge circuits 104 to 106 before staring a test, and recover rest results from the bridge circuits 104 to 106 after the test ends. Between each of the RAMs 101 to 103 and each of the bridge circuits 104 to 106, signals of a chip enable (CE), address (AD0 to ADn), data input/output (Din0/Dout0 to Dinm/Doutm) are inputted/outputted.

Note that configurations of the bridge circuits 104 to 106 depend on the number of words, address configurations of the Rows and Cols, the number of I/Os, and repair methods. Therefore, in accordance with a specification of each of the RAMs 101 to 103, the bridge circuits 104 to 106 are automatically designed. While the bridge circuits 104 to 106 include boundary latches 131 to 133, respectively, a comparator 140, a BISR circuit 150, etc., descriptions thereof will be made later.

[Bridge Circuit]

Figure 5:
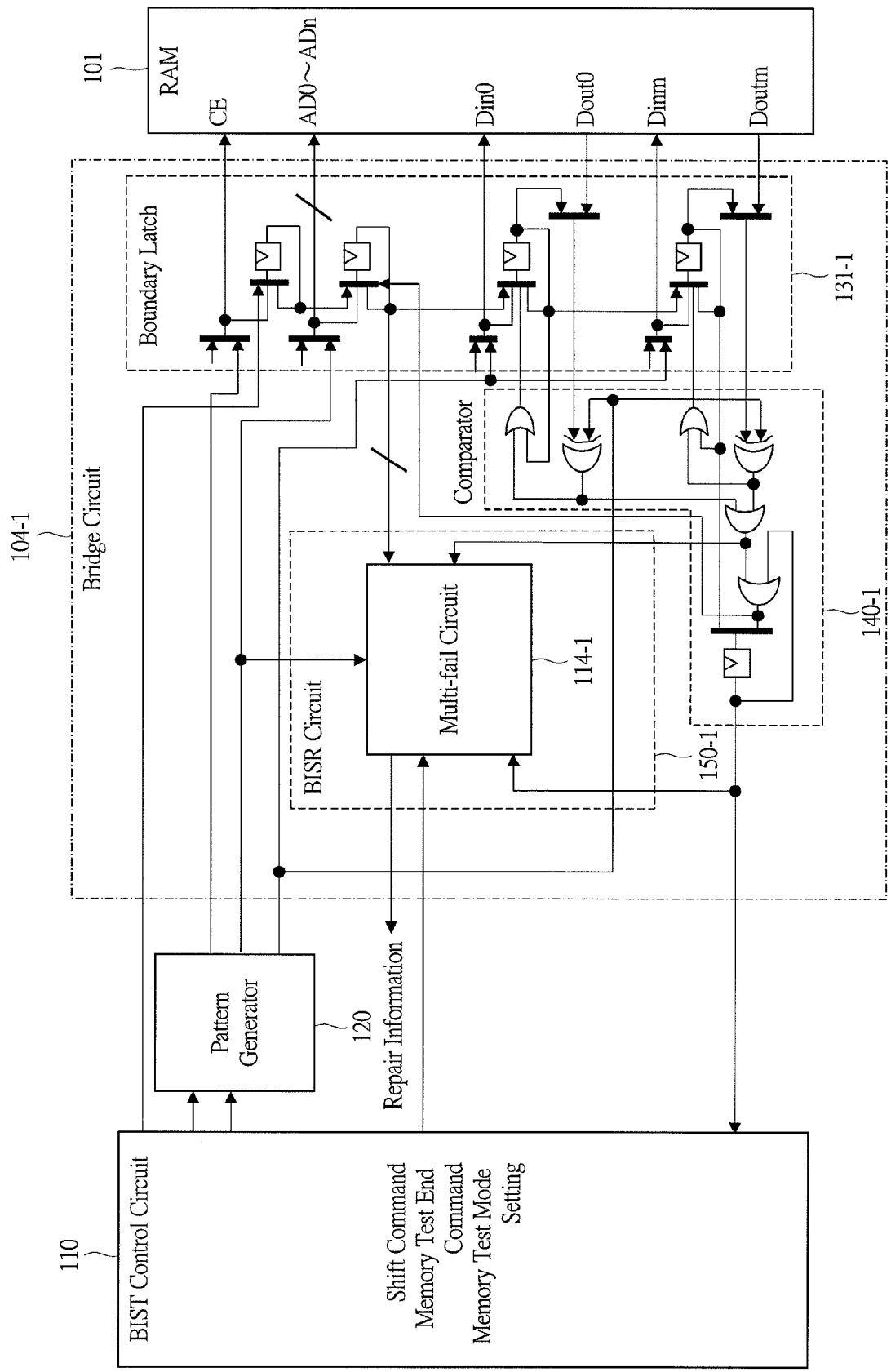
FIG. 5 is a diagram illustrating an example of a bridge circuit for Row repair or Col repair according to the embodiment of the present invention.

FIG. 5 is a diagram illustrating an example of a bridge circuit of Row repair or Col repair. In FIG. 5, only the part of the bridge circuit 104 illustrated in FIG. 4 is illustrated, the other parts (the bridge circuits 105 and 106) are configured in the same manner.

The bridge circuit 104-1 is configured by a boundary latch 131-1, a comparator 140-1, a BISR circuit 150-1 which are connected in a shift-register arrangement. The BISR circuit 150-1 is provided as an attached circuit of the boundary latch 131-1, and the boundary larch 131-1 is also used as a FF (flip-flop) for storing fail address. Then, repair information is obtained based on the fail address stored in the boundary latch 131-1. No special operation is necessary to obtain the repair information, and the repair information can be obtained during a test in operation. Note that the BISR circuit 150-1 is configured by a multi-fail circuit 114-1 which determines repairability mainly from a number of failed Rows (or Cols). Features of the multi-fail circuit 114-1 are: a reduction in a chip area because utilizing the boundary latch 131-1 makes it unnecessary to provide specific hardware for acquiring repair information; and a reduction in a test cost because no specific sequence is necessary for obtaining repair information from fail address.

Figure 6:
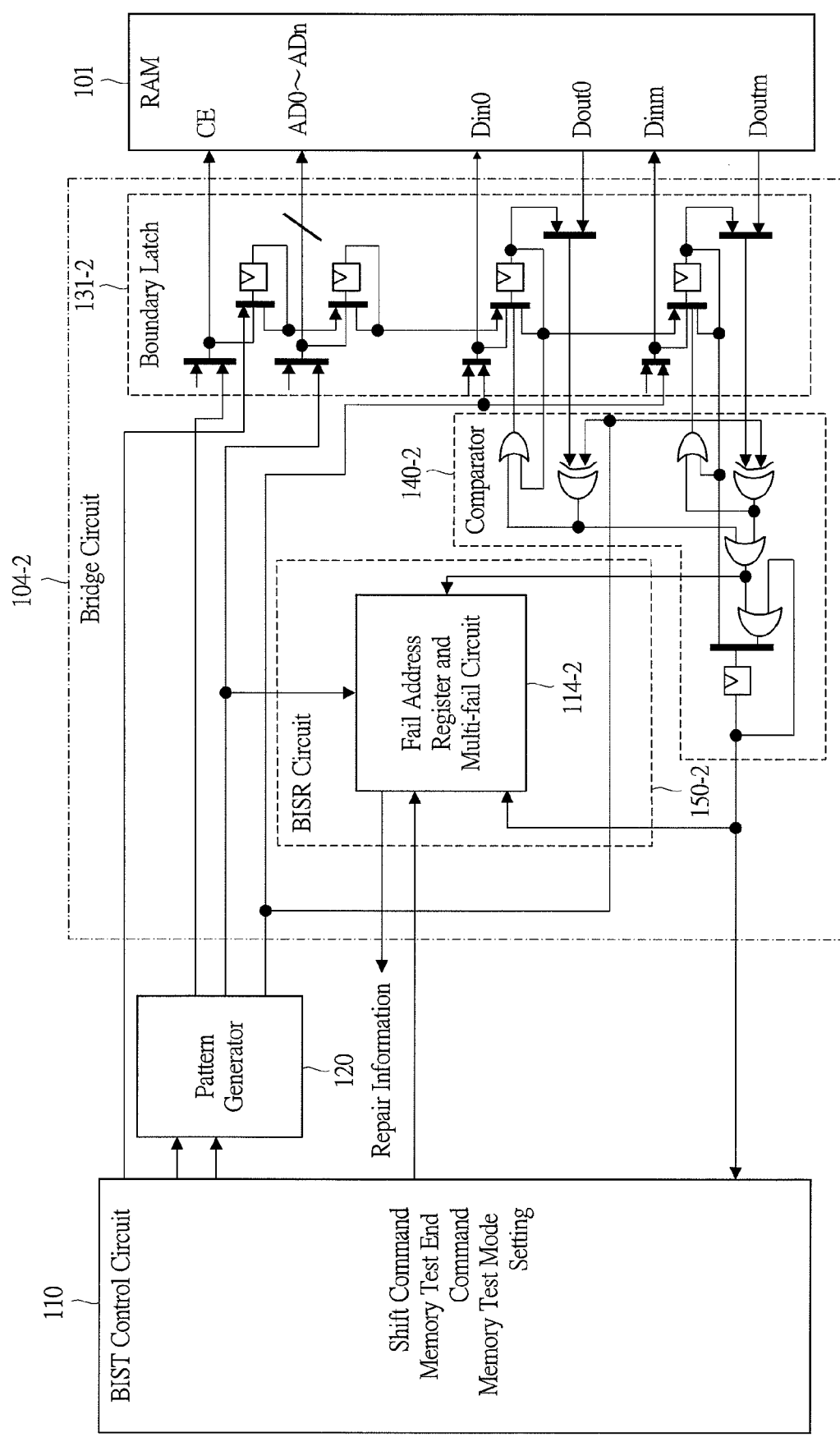
FIG. 6 is a diagram illustrating another example of a bridge circuit for Row repair or Col repair according to the embodiment of the present invention.

FIG. 6 is a diagram illustrating another example of a bridge circuit of Row repair or Col repair.

A bridge circuit 104-2 illustrated in FIG. 6 has a similar configuration as that in FIG. 5, but includes a fail address register and a multi-fail circuit 114-2 in a BISR circuit 150-2.

The fail address register and the multi-fail circuit 114-2 in FIG. 6 are used when a boundary latch 131-2 cannot be utilized or when the boundary latch 131-2 is provided on, for example, the RAM 101 side.

[BISR Circuit]

Figure 7:
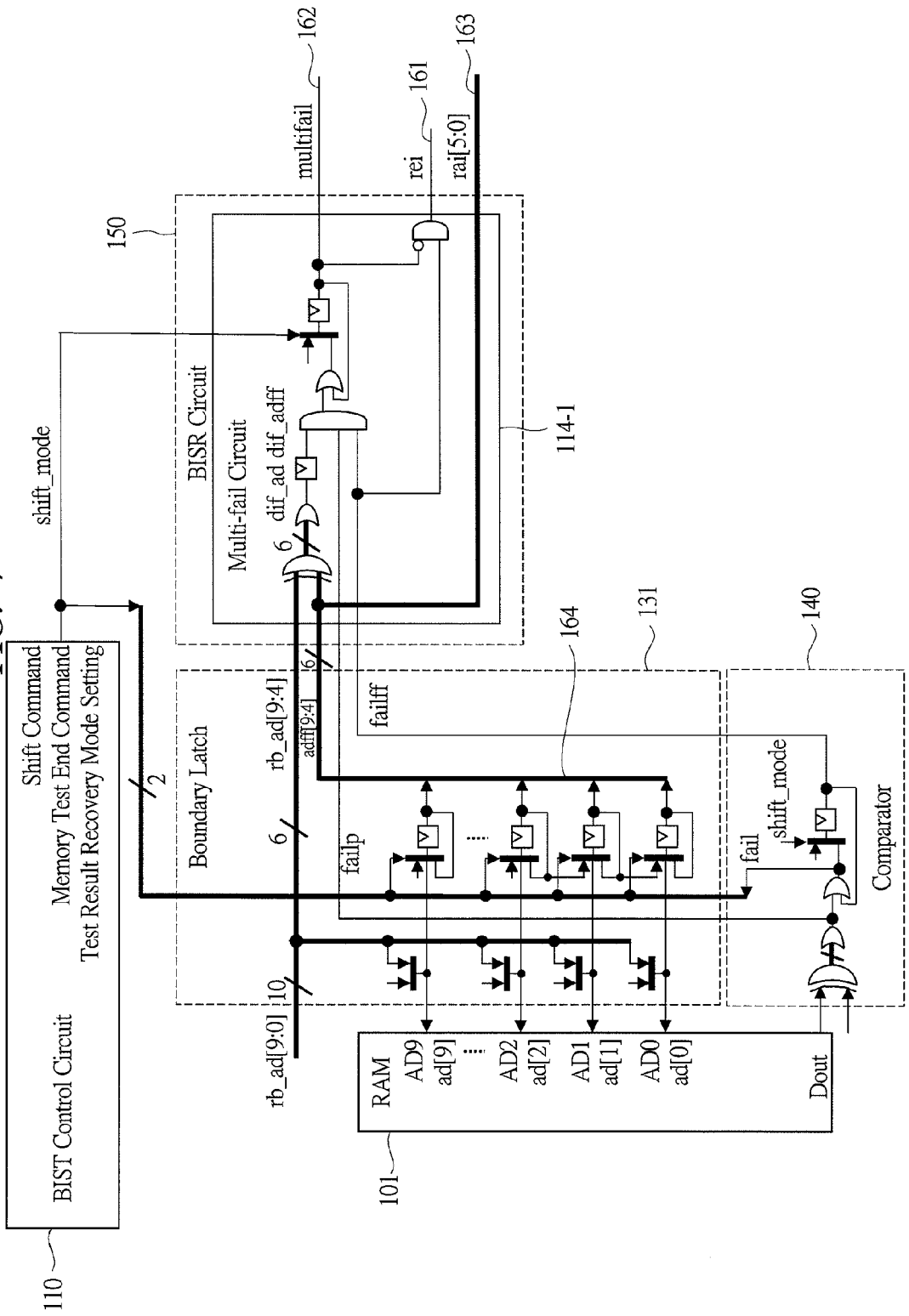
FIG. 7 is a diagram illustrating a detail of the BISR circuit for Row repair according to the embodiment of the present invention.

FIG. 7 is a diagram illustrating the BISR circuit in the case for Row repair. In FIG. 7, an example of the BISR circuit 150 when the bridge circuit 104-1 is provided to the RAM 21 illustrated in FIG. 2. Descriptions of signals in FIG. 7 are in FIG. 8.

As an example, outputs of the multi-fail circuit 114-1 are: repair enable (rei) 161; a signal indicating a plurality of (multiple) Row fails (multifail) 162; and repair address information 5 bits (rai[5:0]) 163. In accordance with the number of Rows and repair unit of the RAM, a Row address 164 to refer is changed, thereby accepting RAMs with different configurations. Also, the Col repair is possible in the same manner, and thus, for example, the RAM 24 illustrated in FIG. 3 is acceptable.

[Operation Concept in Reparable Case]

Figure 9:
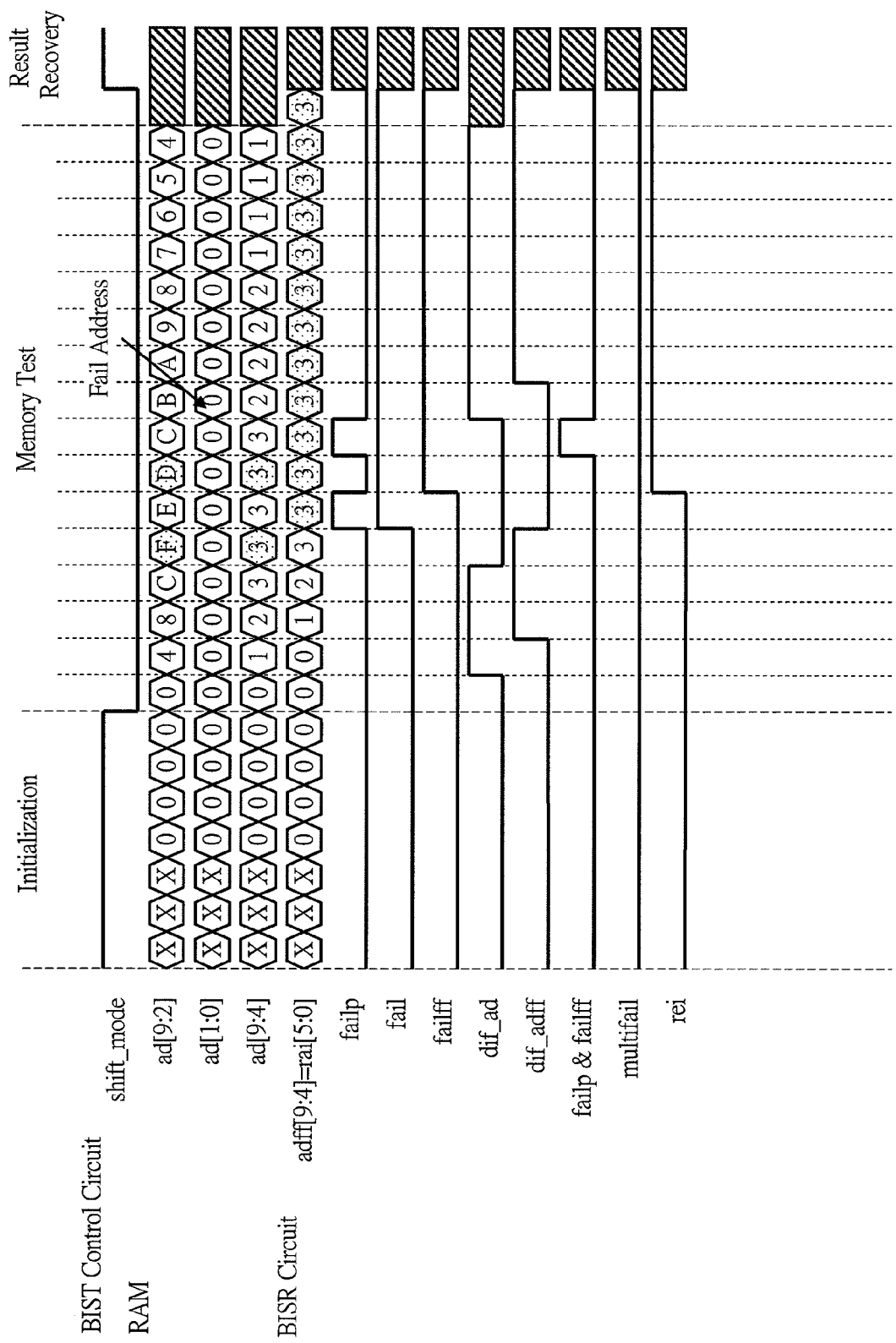
FIG. 9 is a diagram illustrating an operational concept for a repairable case according to the embodiment of the present invention.

FIG. 9 is a diagram illustrating an operation concept in a repairable case. A repairable case with an operation concept of the example in FIG. 7 is illustrated in FIG. 9.

Assume that a failure exists in Rows of Row addresses F and D. When initialization ends, all registers are initialized. 'adff' is controlled by a fail signal. While adff is updated on every access, when a 1st fail occurs, a failed address is acquired, and then, the update will not be made thereafter. If a redundant Row (Row addresses: C to F) can cover a single fail or multiple fails, multifail=0 and thus rei=1, and rei and rai[5:0] can be acquired after the test ends. Note that, since the information is stored in a register, it can be retrieved by a shift operation.

[Operation Concept in Irrepairable Case]

Figure 10:
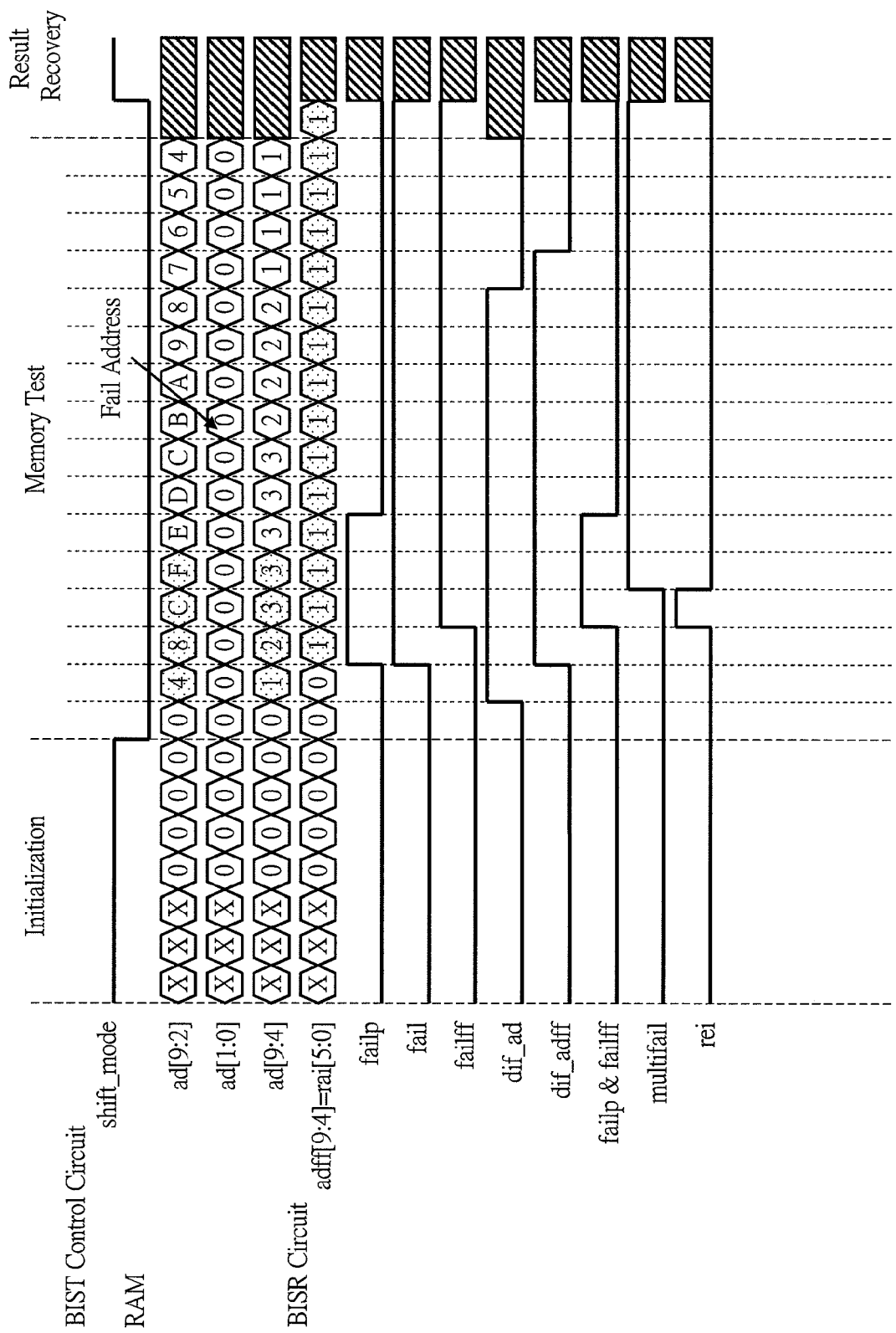
FIG. 10 is a diagram illustrating an operational concept for an irreparable case according to the embodiment of the present invention.

FIG. 10 is a diagram illustrating an operation concept in an irreparable case. An irrepairable case in the operation concept of the example in FIG. 7 is illustrated in FIG. 10.

Assume that there are failures in Rows in Row addresses 4, 8, C, and F. Row address ad[9:4] except for its low-order 2 bits is always compared with adff[9:4]. When a comparison result indicates that they are different when a 2nd fail and later fails occur (dif_ad=1), since a new failure cannot be repaired in the redundant Row (Row addresses: 0-3) which has been allocated to the repair of the 1st fail, the new failure is not repairable and results in multifail=1.

[Repair Design System]

Figure 11:
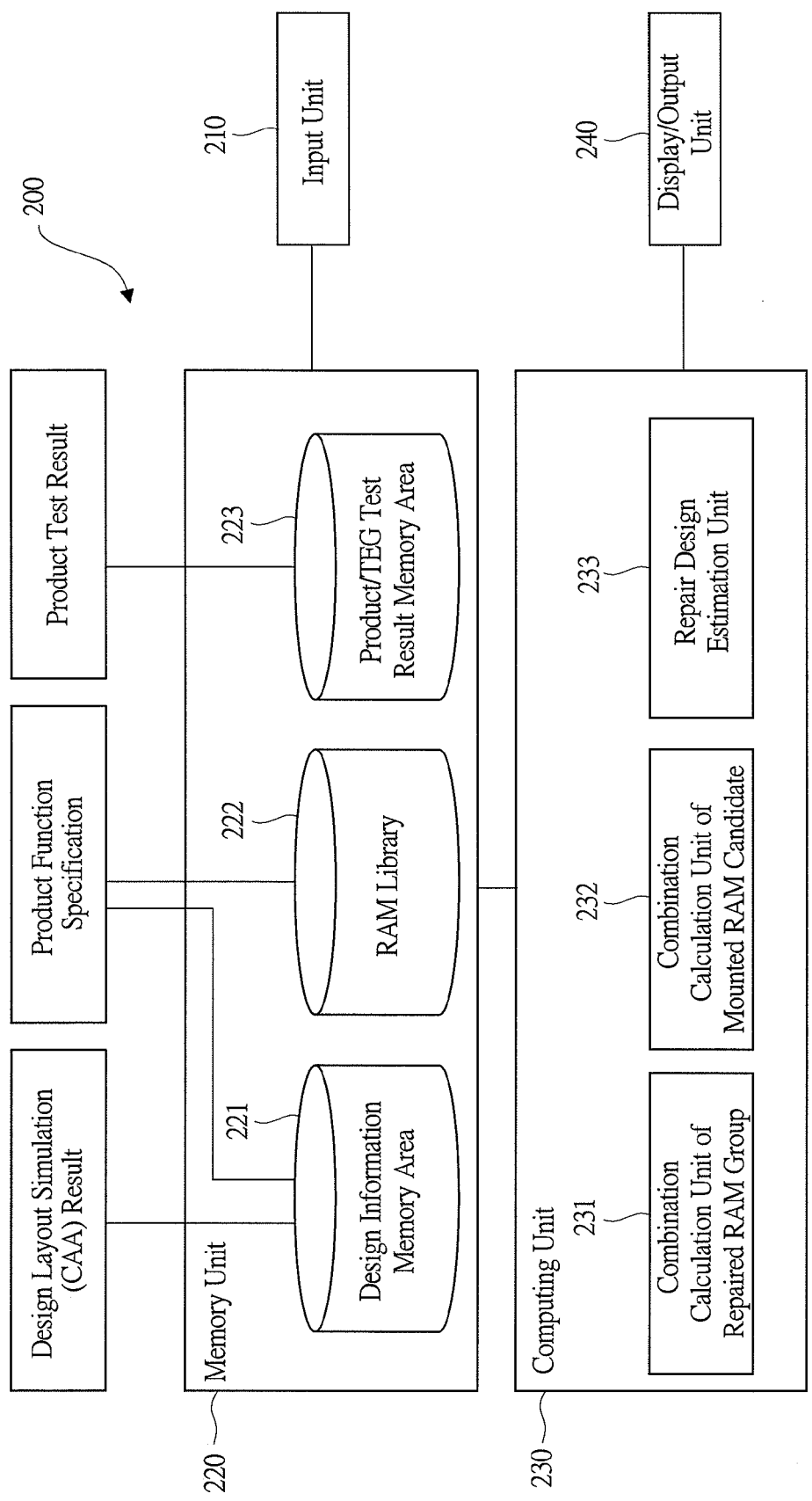
FIG. 11 is a diagram illustrating an outline of a repair design system for achieving the group repair of mixed multiple repair methods in a semiconductor chip according to the embodiment of the present invention.

FIG. 11 is a diagram illustrating an outline of a repair design system for achieving a group repair of mixed multiple repair methods in a semiconductor chip.

As illustrated in FIG. 11, a repair design system 200 according to the present embodiment includes an input unit 210, a memory unit 220, a computing unit 230, and a display/output unit 240. The memory unit 220 includes a design information memory area 221, a RAM library 222, and a product/TEG test result memory area 223. The computing unit 230 includes a combination calculation unit of repaired RAM groups 231, a combination calculation unit of mounted RAM candidates 232, and a repair design estimation unit 233.

The repair design system 200 is built with using a computer system, wherein the memory unit 220 is a device such as an HDD or a memory, the computing unit 230 is a device such as CPU, the input unit 210 is a device such as a keyboard or mouse, and the display/output unit 240 is a device such as a display or printer. The combination calculation unit of repaired RAM groups 231, the combination calculation unit of mounted RAM candidates 232, and the repair design estimation unit 233 in the computing unit 230 are achieved by carrying out combination calculation program of repaired RAM groups, combination calculation program of mounted RAM candidates, and repair design estimation program stored in the CPU or HDD.

The combination calculation unit of repaired RAM groups 231 acquires the number of RAM groups set as a calculation parameter in the design information memory area 221 to extract a combination of repair method candidates. The combination calculation unit of mounted RAM candidates 232 acquires candidates of mountable RAMs which are selected based on a product function specification from the RAM library 222 to extract a combination of mounted RAM candidates. The repair design estimation unit 233 acquires a repair design estimation result based on: a result of a design layout simulation (CAA) per logic unit and RAM type saved in the design information memory area 221; a logic area, an area per RAM, a repair substitution circuit, a redundant memory cell array, a calculation equation of an area of the BIST circuit, a number of fuse bits, and an area of the fuse (or a calculation equation of the area) acquired from the product function specification and saved in the design information memory area 221; and an average failure density data saved in the product/TEG test result memory area 223.

In addition, the repair design estimation unit 233 can calculate a repair design estimation result per combination which is extracted in the combination calculation unit of repaired RAM groups 231 and the combination calculation unit of mounted RAM candidates 232 based on: a logic area, an area per RAM, a unit and an area of the fuse, a calculation equation of the area of the fuse to be mounted on the chip, a calculation equation of the repair substitute circuit per repair method, a calculation equation of the redundant memory cell array, and a calculation equation of the area of the BIST circuit, which are saved in the design information memory area 221; and data of a failure rate of the logic unit and failure data per fail-bit mode in the memory unit saved in the product/TEG test result memory area 223.

To the repair design system 200 according to the present embodiment, a CAA layout simulation device, a design database, and a test device for testing functional module, etc. are connected. A design layout simulation (CAA) result and design information are sent to the design information memory area 221. Design information is sent to the RAM library 222. Product test result information is sent to the product/TEG test result memory area 223.

Estimation of the repair method is performed by the repair design system 200 according to the present embodiment, so that the most suitable repair method is determined from an estimation result herein. In the following, a most suitable repair method will be described in more detail in each embodiment.

<First Embodiment>

In a first embodiment, a method of making the repair design of mixed multiple repair methods suitable will be described with reference to FIG. 11.

Each repair method has different areas for the repair circuit, redundant memory cell array, and BIST circuit when I/O repair, Col repair, or Row repair is mounted, and a chip yield after repair is also different in each repair method. Thus, the most suitable repair method of RAMs is required to be determined in consideration of a trade-off of an increase in RAM area due to mount of a repair circuit and an improvement in yield. Accordingly, a required area for good RAM is defined as expressed by Equation (1) as an index value in consideration of the above factors.

$$GA_{RAM\_n} = A'_{RAM\_n} / Y'_{RAM\_n} \qquad \text{Equation (1)}$$

Here, $GA_{RAM\_n}$ [cm$^2$] is a required area for good RAM, $A'_{RAM\_n}$ [cm$^2$] is an area of RAM_n after mounting a repair circuit (i.e., a sum of areas of the RAM, repair circuit, redundant memory cell array, and BIST circuit), and $Y'_{RAM\_n}$ [%] is a chip yield of RAM_n after repair. A repair method having a minimum area for good RAM $GA_{RAM\_n}$ is the most suitable repair method for any subject RAM.

However, in the group repair of mixed multiple repair methods, using the most suitable repair method to all the RAMs is not always the most suitable group repair method as a whole chip, and thus it is necessary to make the group repair method for the whole chip suitable.

For example, regarding a chip mounting 100 memories having the same scale, when the number of RAMs having the minimum required area for good RAM when using the Row repair is 2, the number of RAMs having the minimum required area for good RAM when using the I/O repair is 98, and the number of repair groups is 2, a better way for making the repair efficiency the most suitable as the whole chip is, even when repair methods of two of the 100 RAMs are the Row repair method, to group the 100 RAMs into two I/O repair groups by changing the Row repair method of the two RAMs into the I/O repair method leads to a suitable repair method rather than to group the 100 RAMs into a group of Row repair method to which only the two RAMs belong and a group of I/O repair method to which 98 RAMs belong. Therefore, in the group repair of mixed multiple repair methods, it is necessary to make the number of groups suitable so that the required area for good RAM as a whole chip becomes minimum. Accordingly, the inventors have considered finding a repair design method which makes the area for good RAM minimum by defining the area for good RAM as Equation (2).

$$GA_{chip} = \frac{\left(\sum_{i=1}^{a} A'_{RAM\_Gr.i} + \sum_{1}^{b} A_{NoRep\_RAMii} + A_{Logic} + A'_{Fuse}\right)}{\left(\prod_{i=1}^{a} Y'_{RAM\_Gr.i} \times \prod_{ii=1}^{b} Y_{NoRep\_RAMii} \times Y_{Logic} \times Y'_{Fuse}\right)} \quad \text{Equation (2)}$$

Herein, $GA_{chip}$ [cm$^2$] is a required area for good chip, $A'_{RAM\_Gr.i}$ [cm$^2$] is a total area of RAMS and circuits (redundant circuit, repair circuit, and BIST circuit) to be mounted for repair per RAM group (RAM_Gr.i), $A_{NoRep\_RAMii}$ [cm$^2$] is a chip area per RAM (RAMii) not mounting a repair circuit, $A'_{Fuse}$ [cm$^2$] is an area of fuse, $A_{Logic}$ [cm$^2$] is a chip area of logic unit (other area than $A'_{RAM\_Gr.i}$, $A_{NoRep\_RAMii}$, and $A'_{Fuse}$), $Y'_{RAM\_Gr.i}$ [%] is a yield per RAM group (RAM_Gr.i) after repair, $Y_{NoRep\_RAMii}$ [%] is a yield per RAM (RAMii) not mounting a repair circuit, $Y'_{Fuse}$ [%] is a yield of fuse, and $Y_{Logic}$ [%] is a yield of logic unit.

Herein, the chip area after mounting a repair circuit per RAM group (RAM_Gr.i) $A'_{RAM\_Gr.i}$ [cm$^2$] the area of fuse $A'_{Fuse}$ [cm$^2$], the yield per RAM group (RAM_Gr.i) after repair $Y'_{RAM\_Gr.i}$ [%], and the yield of fuse $Y'_{Fuse}$ [%] vary depending on the repair method to be mounted even when they are results obtained from the same RAM group.

The yield per RAM group (RAM_Gr.i) after repair $Y'_{RAM\_Gr.i}$ [%] the yield per RAM (RAMii) not mounting a repair circuit $Y_{NoRep\_RAMii}$ [%], the yield of logic unit $Y_{Logic}$ [%], and the yield of fuse $Y'_{Fuse}$ [%] can be calculated from Equation (3) or Equation (4).

$$Y'_{RAM\_Gr.i} = \exp\left(-D0 \times \sum_{1}^{c} Ac_{RAMc}\right) + REP_{RAM\_Gr.i} \quad \text{Equation (3)}$$

$$Y_{NoRep\_RAMii} = \exp(-D0 \times Ac_{NoRep\_RAMii})$$
$$Y_{Logic} = \exp(-D0 \times Ac_{Logic})$$
$$Y'_{Fuse} = \exp(-D0 \times Ac'_{Fuse})$$

$$Y'_{RAM\_Gr.i} = \exp\left(-D_{RAM} \times \sum_{1}^{c} A_{RAMc}\right) + REP_{RAM\_Gr.i} \quad \text{Equation (4)}$$

$$Y_{NoRep\_RAMii} = \exp(-D_{RAM} \times A_{NoRep\_RAMii})$$
$$Y_{Logic} = \exp(-D_{Logic} \times A_{Logic})$$
$$Y'_{Fuse} = \exp(-D_{Logic} \times A'_{Fuse})$$

Herein, D0 in Equation (3) is an average fail density [pieces/cm$^2$] acquired from the product/TEG test result memory area 223; $Ac_{RAMc}$, $Ac_{NoRep\_RAMii}$, $Ac_{Logic}$, $Ac'_{Fuse}$ are a critical area of RAM unit per RAM which belongs to RAM group (RAM_Gr.i) (except for the redundant circuit, repair circuit and BIST circuit), a critical area per RAM (RAMii) not mounting repair circuit, a critical area of logic unit, and a critical area of fuse acquired from the design information memory area 221, respectively. $REP_{RAM\_Gr.i}$ is a generation rate of repairable failures among failures generated in RAMs belonging to the RAM group (RAM_Gr.i).

$D_{RAM}$ and $D_{Logic}$ in Equation (4) are critical failure densities [pieces/cm$^2$] calculated from Equation (5) below by using $F_{RAM}$ and $F_{Logic}$ which are failure rates of the RAM unit and Logic unit before repair acquired from the product/TEG test result memory area 223. $A_{RAMc}$, $A_{NoRep\_RAMii}$, $A_{Logic}$, $A'_{Fuse}$ are an area of RAM unit belonging to the RAM group (RAM_Gr.i) (except for the redundant circuit, repair circuit and BIST circuit), an area per RAM (RAMii) not mounting a repair circuit, an area of logic unit, and an area of fuse, respectively.

$$D_{RAM} = -\ln(1 - F_{RAM})/A_{RAM}$$

$$D_{Logic} = -\ln(1 - F_{Logic})/A_{Logic} \quad \text{Equation (5)}$$

Herein, $A_{RAM}$ is a total area of RAMs (except for the redundant circuit, repair circuit and BIST circuit). In addition, $D_{RAM}$ may be obtained by giving a total area of RAMs including the redundant circuit, repair circuit and BIST circuit to $A_{RAM}$, and giving a failure rate after repair to $F_{RAM}$. Calculation methods of repair yield including the calculation method of $REP_{RAM\_Gr.i}$ are reported in, for example, S. E. Schuster, "Multiple Word/Bit Line Redundancy for Semiconductor Memories," IEEE Journal of Solid-State Circuits, Vol. SC-13, No. 5, pp. 698-703, 1978 (Non-Patent Document 1) and Y. Hamamura et al., "Repair yield simulation with iterative critical area analysis for different types of failure," IEEE International Symposium on Defect and Tolerance in VLSI Systems, pp. 305-313, 2002 (Non-Patent Document 2).

When designing the group repair of mixed multiple repair methods, sorting of RAMs mounting repair circuit and RAMs not mounting repair circuit, grouping of repaired RAMs on RAMs mounting repair circuit, and determination of repair method per group are necessary, and a method which makes the required area for good chip minimum is required to be selected by making these events suitable. Hereinafter, a summary of the first embodiment will be described with reference to FIGS. 12, 13, 14, 15A and 15B.

Figure 12:
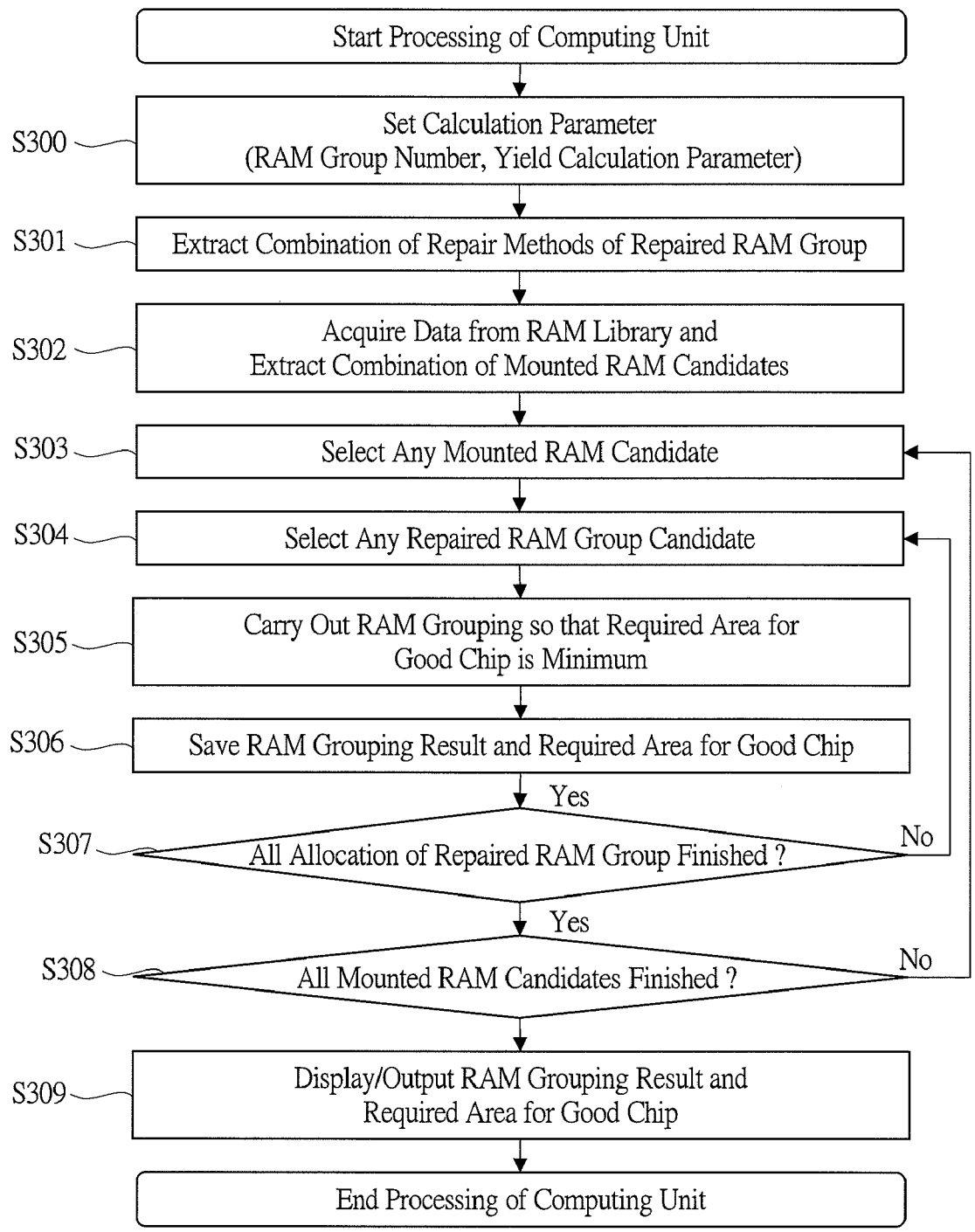
FIG. 12 is a flow chart illustrating a processing of a computing unit in the repair design system according to the embodiment of the present invention.

FIG. 12 is a flowchart illustrating a processing of the computing unit 230 in the repair design system 200.

[Step 300] A number of repaired RAM groups and a yield calculation parameter are set as calculation parameters. The yield calculation parameter is used in the yield predictive calculation expressed by Equation (3) or (4), and one of the following two parameter sets is selected. One is a parameter corresponding to Equation (3), wherein a critical area saved in the design information memory area 221 and an average failure density saved in the product/TEG test result memory area 223 are set. The other one is a parameter corresponding to Equation (4), wherein an area saved in the design information memory area 221, logic saved in the product/TEG test result memory area 223, and a performance failure rate of RAMs are set.

[Step 301] Based on the number of repaired RAM groups set in the step 300, all combinations of repair methods per repaired RAM group are extracted. For example, when the number of RAM groups is set to 3, combinations of repair methods per repaired RAM group are as listed in FIG. 13.

FIG. 13 is a diagram illustrating examples of extracting combinations of repaired RAM group candidates. In the example of FIG. 13, for example, the number of groups of I/O repair is 0, the number of groups of Row repair is 3, and the number of groups of Col repair is 0 in the combination I. Other combinations are as listed in FIG. 13.

[Step 302] With using information on the product function specification, all of a plurality of combinations of mounted RAM candidates satisfying the design specification are extracted from RAMs saved in the RAM library 222.

[Step 303] Any candidate is selected from the combinations of mounted RAM candidates extracted in the step 302.

[Step 304] Any candidate is selected from the combinations of repaired RAM groups extracted in the step 301.

[Step 305] RAM grouping is carried out on the any mounted RAM candidate selected in the step 303 and the any repaired RAM group candidate selected in the step 304 to make the required area for good chip minimum.

[Step 306] A result of the repaired RAM grouping on the any repaired RAM candidate and the any repaired RAM group candidate carried out in the step 305, and the required area for good RAM are saved in the repair design estimation unit 233.

[Step 307] Whether a RAM grouping has been carried out (allocation end) is researched on all the repaired RAM group candidates extracted in the step 301. When the grouping has not been carried out, the processing is back to the step 304.

[Step 308] Whether a RAM grouping has been carried out (allocation end) is researched on all the mounted RAM group candidates extracted in the step 302. When the grouping has not been carried out, the processing is back to the step 303.

[Step 309] A repaired RAM grouping result and the required area for good RAM are outputted and displayed on the output/display unit 240.

Figure 15A:
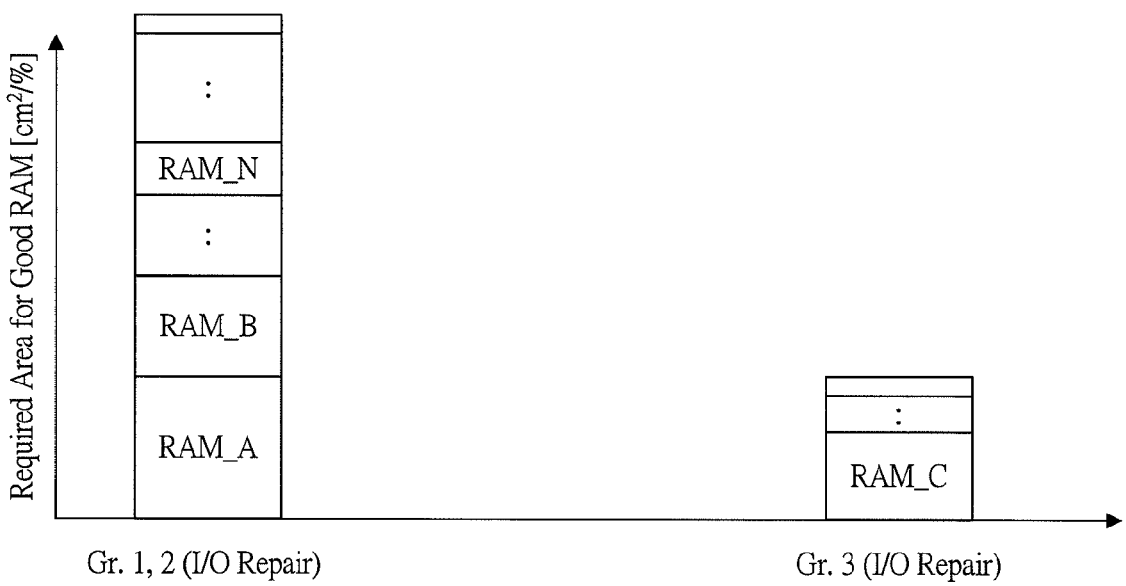
FIGS. 15A and 15B are diagrams illustrating a concept of a method of suitably allocating RAM repair group candidates according to the embodiment of the present invention.
Figure 15B:
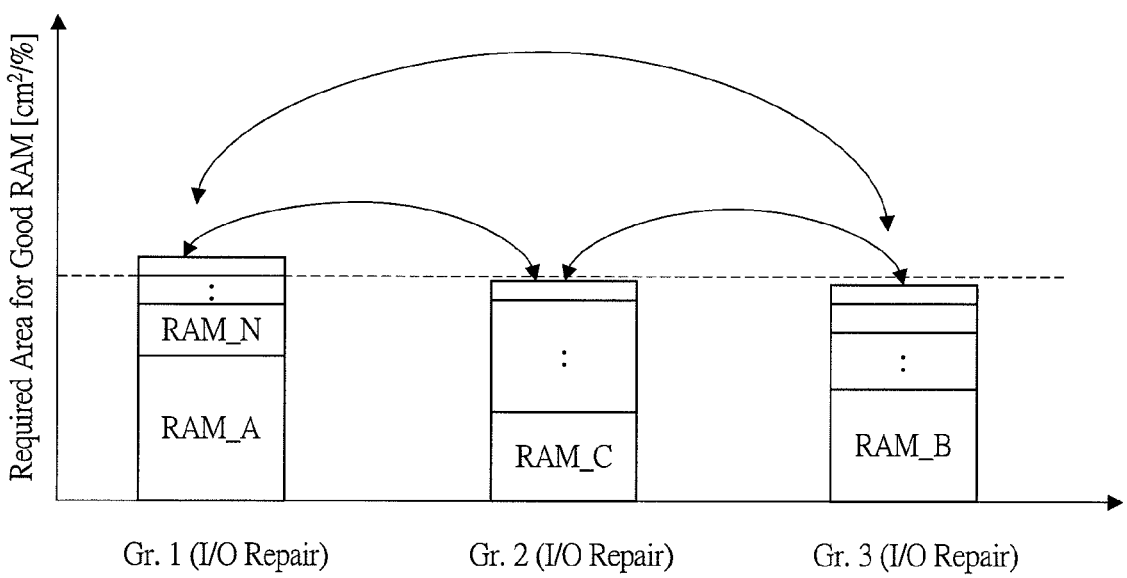

With reference to FIGS. 14 and 15A-15B, a determination of a RAM mounting a repair circuit and a RAM not mounting a repair circuit, and a method of making an allocation to repaired RAM group suitable will be described as methods for minimizing the required area for good chip. FIG. 14 is a diagram illustrating a list of required areas for good RAM. FIG. 15 is a diagram illustrating a concept of the method of making an allocation to repaired RAM group suitable.

First, with using Equation (1), the required area for good RAM when a repair circuit is not mounted and the required area for good RAM per repair method are calculated per RAM to obtain a method making the required area for good RAM minimum. FIG. 14 illustrates results of calculating the required areas for good RAM for RAMA, RAMB, and RAMC, wherein the required areas for good RAM are minimum in the case of I/O repair in RAMA; in the case of no repair in RAMB; and in the case of Row repair in RAMC.

Here, RAMB having a minimum required area for good RAM when there is no repair indicates that a penalty of an increase in the RAM area along with mounting a repair circuit is larger than an improvement in yield, and also means that it is advantageous not to mount a repair circuit. Thus, RAMB is sorted into the RAM not mounting repair circuit.

Next, making allocation to repaired RAM group suitable is carried out on RAMs mounting a repair circuit. Herein, first, repair methods making the required area for good RAM minimum are selected and sorted per RAM regarding repair methods included in the repaired RAM group candidates. FIGS. 15A and 15B illustrate cases in which any repaired RAM group candidates selected in the step 304 are two groups of I/O repair (Gr. 1 and Gr. 2) and one group of Row repair (Gr. 3). In this case, values of the RAM of the I/O repair and Row repair are compared among the required areas for good RAM calculated from FIG. 14, and a smaller one is selected.

For example, in the case of FIG. 14, as illustrated in FIG. 15A, repaired RAMA is allocated to the group of I/O repair method, and RMAC is allocated to the group of Row repair method. Thereafter, as illustrated in FIG. 15B, allocation of repair methods to RAMS is performed to equalize the required area for good RAM of each group. Here, the most suitable required area for good RAM and the other required areas for good RAM when using other repair methods are compared, and a shift is started from a RAM having the smallest difference in the required area for good RAM.

That is, in the example of FIGS. 15A and 15B, equalization is first advanced between Gr. 1 and Gr. 2 having no difference in required area for good RAM so that the required area for good chip is minimum, and then equalization including Gr. 3 is advanced. Here, every time the RAM group is shifted, the area of redundant memory cell array, the area of repair circuit, and the area of fuse per the repaired RAM group are changed, and thus the required area for good chip after shift is calculated for every shift.

Determination of equalization end (stop of RAM shift) is made, for example, when the required area for good chip after shift becomes bigger than that before shift, or, when the required area for good chip becomes larger than that before shift for consecutive N times, etc. It is needless to say that other methods can be also applicable.

<Second Embodiment>

A second embodiment is different from the first embodiment in the method of making allocation to repaired RAM group suitable. More specifically, another example of the computing unit 230 in the repair design system 200 for making the allocation to repaired RAM group suitable described in the first embodiment will be described below.

As a method of equalization for making the allocation to repaired RAM group suitable, a method of shifting from a RAM having a small difference in the required area for good RAM between repair methods is adopted. Meanwhile, other shift strategies such as a method of random multi-start local search, genetic algorithm, simulated annealing, etc. can be used.

<Third Embodiment>

A third embodiment is a still another example with respect to the first and second embodiments. More specifically, while the required area for good chip has been defined and the equalization has been performed so that the value of the area is minimum in the first and second embodiments, the equalization is not limited to this as long as it uses an index value using a chip area and a yield in consideration of increase/decrease of the redundant memory cell array, repair circuit, fuse area along with mounting a repair circuit.

<Fourth Embodiment>

A fourth embodiment is still another example with respect to the first to third embodiments. More specifically, while the required area for good RAM has been used as a method of selecting RAMs not mounting repair circuit in the first and second embodiments, there is another method of designating RAMs not mounting repair circuit by a user. For example, a case where a user designates any RAMs not accepting mounting of a repair circuit in the function specification, or a case where RAMs having a substandard scale are excluded from repairing subjects are considered.

<Fifth Embodiment>

A fifth embodiment is a still another example with respect to the first to fourth embodiments. More specifically, another example of output/display of the repair design system 200 and the display/output unit 240 which outputs and displays a result of minimizing the required area for good chip described in the first to fourth embodiments will be described with reference to FIGS. 16 to 18.

Figure 16:
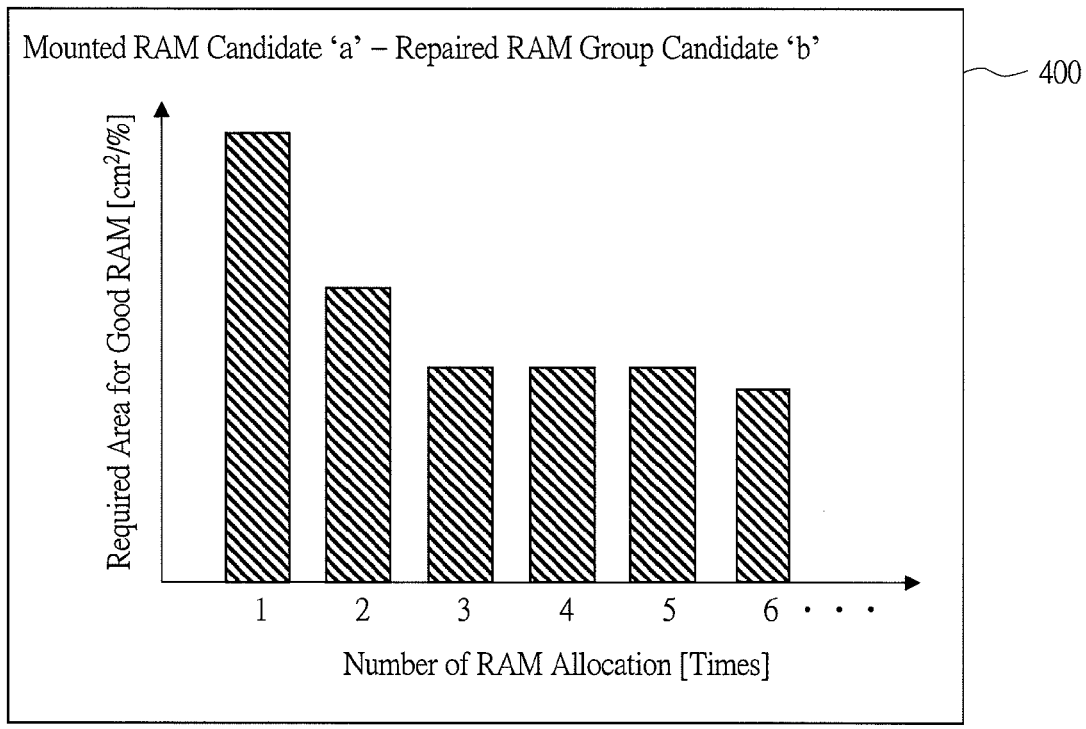
FIG. 16 is a diagram illustrating an outline of a graph indicating a required area for good chip of each equalization step for any repaired RAM group candidates among any mounted RAM candidates according to an embodiment of the present invention.

FIG. 16 is a diagram illustrating an outline of a graph 400 illustrating required areas for good chip per equalization step between a mounted RAM candidate and a repaired RAM group candidate (any repaired RAM group candidate 'b' for any mounted RAM candidate 'a'). The graph 400 illustrates a transition of calculation for making the allocation to repaired RAM group candidate suitable, and the transition can be outputted and displayed per RAM candidate and repaired RAM group candidate.

Figure 17:
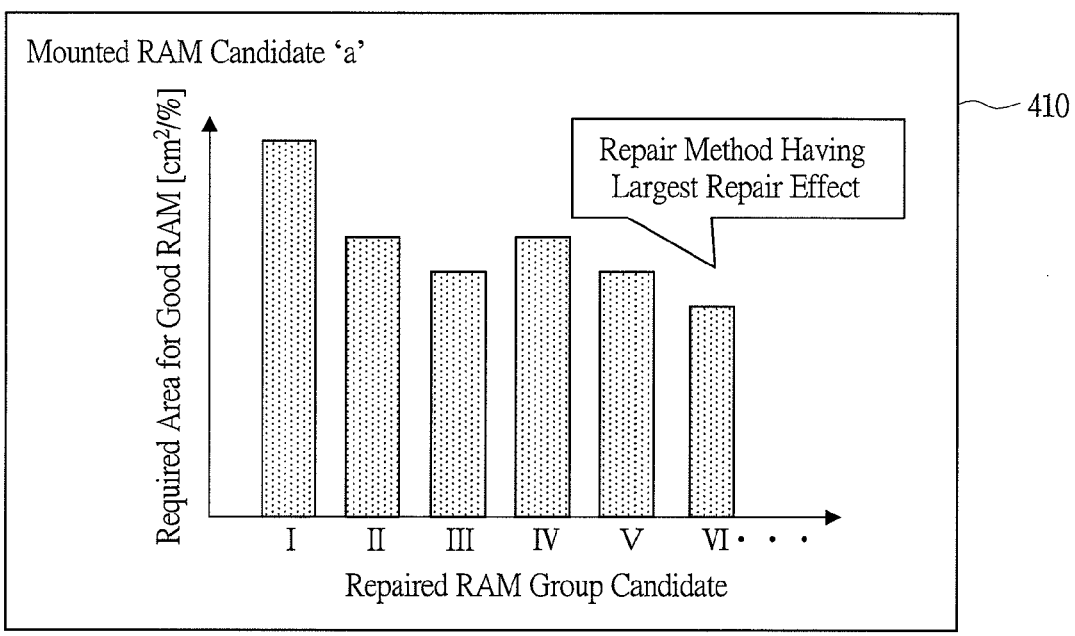
FIG. 17 is a diagram illustrating an outline of a graph indicating a required area for good chip of each repaired RAM group candidate according to the embodiment of the present invention.

FIG. 17 is a diagram illustrating an outline of a graph 410 displaying required areas for good chip per repaired RAM group candidate (a repaired RAM group for any mounted RAM candidate). The required area for good chip indicates, for example, a specified value of a minimum required area for good chip per repaired RAM group candidate etc. When the minimum value is used, a memory configuration having the most suitable repaired RAM group can be selected from any mounted RAM candidates 'a'. The graph 410 is created per mounted RAM candidate.

Figure 18:
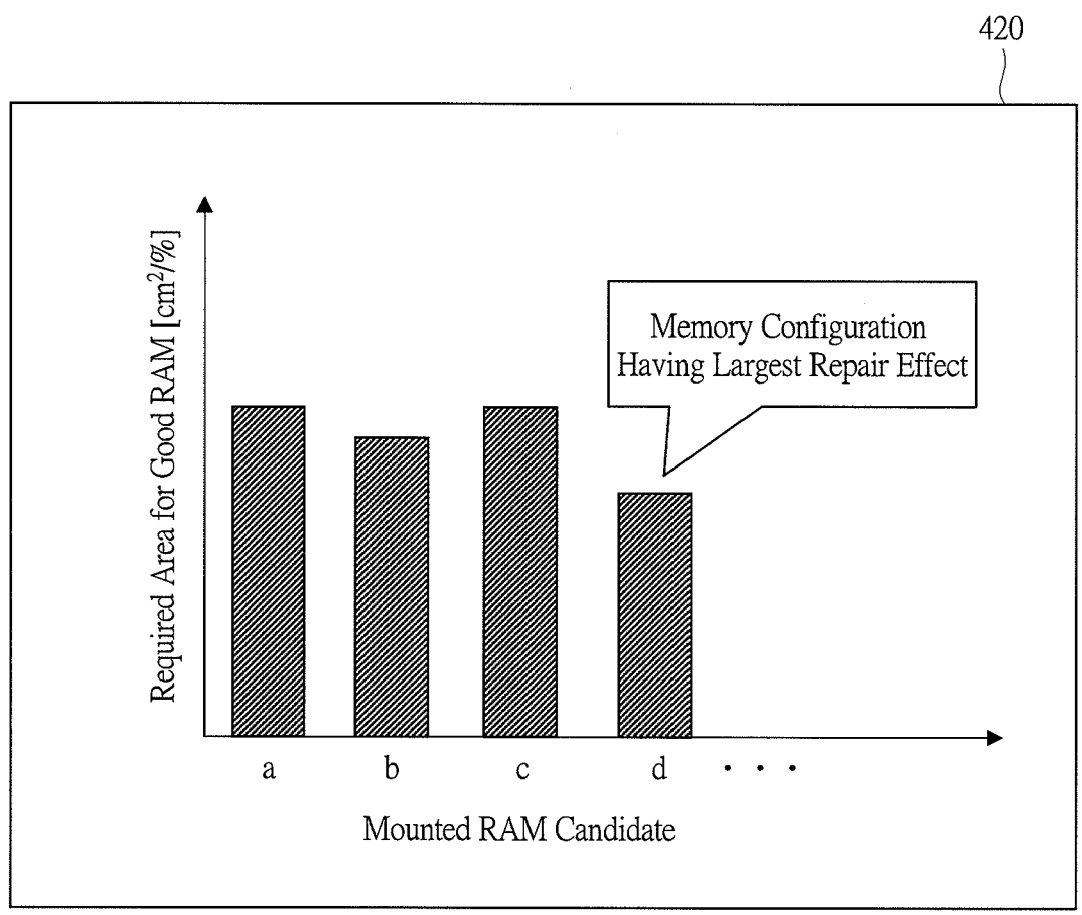
FIG. 18 is a diagram illustrating an outline of a graph indicating a result of required areas for good chip per mounted RAM candidate according to the embodiment of the present invention.

In addition, FIG. 18 is a diagram illustrating an outline of a graph 420 displaying a result of making the required area for good chip per mounted RAM candidate suitable. Each required area for good chip of each mounted RAM candidate indicates a specified value, for example, a minimum value of each of required areas for good chip per repaired RAM group candidates illustrated in FIG. 17, for example.

When the minimum value is displayed, the most suitable RAM candidate and its repaired RAM group candidate can be selected from all the mounted RAM candidates.

<Summary of the Embodiments and Effects of the First to Fifth Embodiments>

According to the Summary of the Embodiments and the first to fifth embodiments described above, the following effects can be obtained by providing repair circuits and repair design methods of I/O repair, Row repair, and Col repair which achieve the "group repair of mixed multiple repair methods."

(1) Whether mounting a repair circuit or not can be selected and a repair circuit method can be selected with respect to a repaired RAM in accordance with the number of I/Os of RAMs, a shape of a memory cell array of each I/O, and a scale of the RAM. Thus, the repair efficiency can be improved as compared with the conventional I/O group repair, thereby contributing to an improvement in product margin.

(2) Since special hardware for acquiring repair information is not necessary as a boundary latch is used, the chip area can be reduced.

(3) A conventional repair analysis system (ATE: automatic test equipment) accumulates fail addresses during the tests and carries out repair analyses such as repairability determination and repair code generation etc. after tests end. Meanwhile, in the present method, since repair information can be obtained from fail addresses, a special sequence is not necessary and the test time can be shortened than the conventional method, and thus a test cost can be reduced.

(4) Since the Col repair and Row repair take shorter repair test time including repair analyses than the I/O repair, an increase in test time along with mixed mounting of multiple repair methods can be suppressed.

(5) Since the most suitable candidate and its repair design method can be selected among a plurality of mounted RAM candidates satisfying required function, the present embodiments can contribute to an improvement in product margin.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a technique effectively applied to mounting of a test circuit of RAM and a test circuit of logic circuit in a semiconductor chip embedding a plurality of (multiple) RAMs and logic circuits, the semiconductor chip being a thin-film device represented by an LSI. The present invention further relates to a technique for determining a repair method of RAMs. For example, the present invention can be applied to a logic LSI such as a system LSI embedding RAMs and CPUs.

What is claimed is:

1. A repair design method of a semiconductor chip by a repair design system including: a critical area calculated by a layout simulation which virtually drops a plurality of foreign objects to a design layout; a memory unit which memorizes product/TEG test result from design information of a logic unit and a RAM unit, RAM library information, and a product test result acquired from a product function specification; and a computing unit which makes an allocation to a mounted RAM and a repaired RAM group of the mounted RAM suitable using a result of the memory unit, wherein the computing unit carries out: a first step of calculating combinations of repaired RAM group candidates based on a number of groups set by a user; a second step of calculating combinations of repaired RAM candidates using the design information of RAM unit memorized in the memory unit; a third step of determining a design method of a group repair of mixed multiple repair methods which adopts a group repair selecting a repair method from a plurality of repair methods and grouping RAMs of the same repair method into one or more groups by using the critical area, the design information of the logic unit and the RAM unit, and the product test result.

2. The repair design method of the semiconductor chip according to claim 1, wherein in the third step, upon determining a design method of the group repair of mixed multiple repair methods, an index value which is set in consideration of a trade-off of a yield after repairing the chip and an increase in areas of a redundant memory cell array, a repair substitution circuit, a BIST circuit, and a fuse along with mounting a repair circuit is used.

3. The repair design method of the semiconductor chip according to claim 2, wherein,
upon calculating the index value, an index value set in consideration of a yield after repairing the chip and an increase in areas of a redundant memory cell array, a repair substitution circuit, a BIST circuit, and a fuse is calculated per repaired RAM group, and a repaired RAM group is determined by allocating a repaired RAM group so that the index values per repaired RAM group are equalized.

* * * * *